United States Patent

[11] 3,633,114

[72] Inventor Suman H. Patel Arlington, Mass.
[21] Appl. No. 61,919
[22] Filed Aug. 7, 1970
[45] Patented Jan. 4, 1972
[73] Assignee Sylvania Electric Products, Inc.

[54] COUNTER CIRCUIT
9 Claims, 7 Drawing Figs.

[52] U.S. Cl. .......... 328/48, 307/225, 307/291, 328/55, 328/42
[51] Int. Cl. .......... H03k 21/32
[50] Field of Search .......... 328/48, 55, 42, 45; 307/225, 291

[56] References Cited

UNITED STATES PATENTS

| | | | |
|---|---|---|---|
| 3,238,461 | 3/1966 | Merriam | 328/55 X |
| 3,295,039 | 12/1966 | MacDonald et al. | 328/48 X |
| 3,381,227 | 4/1968 | Kovanic | 328/48 X |
| 3,381,220 | 4/1968 | Burr | 328/55 X |

*Primary Examiner*—John S. Heyman
*Attorneys*—Norman J. O'Malley, Elmer J. Nealon and David M. Keay

ABSTRACT: Counter circuit including four bistable stages arranged to count upward through a recurring sequence of combinations of operating states of the bistable stages in response to clock pulses. The bistable stages can be set to any of the combinations of operating states. The circuit includes an output section which produces an output signal a first delay period after the final clock pulse of a sequence is received and which terminates the output signal a second delay period shorter than the first delay period after the next clock pulse is received. Five countercircuits are cascaded in series with only a single AND gate as additional logic circuitry to provide a counter capable of counting through a count equal to five magnitudes of an individual counter circuit.

INVENTORS
SUMAN H. PATEL

BY David M. Kay

AGENT

INVENTORS
SUMAN H. PATEL

BY David M. Keay

AGENT

INVENTORS
SUMAN H. PATEL

BY David M. Keay

AGENT

INVENTORS
SUMAN H. PATEL
BY David M. Keay
AGENT

INVENTORS
SUMAN H. PATEL
BY David M. Keay
AGENT

INVENTORS
SUMAN H. PATEL
BY David M. Keay
AGENT

COUNTER CIRCUIT

BACKGROUND OF THE INVENTION

This invention relates to bistable logic circuits. More particularly, it is concerned with countercircuits employing a plurality of bistable stages and with output circuitry for reading out the data in the counter at a particular point in the count.

One type of logic subsystem which is widely used in electronic data processing is a counter. Countercircuits include several bistable flip-flop stages which are interconnected so as to switch through a recurring sequence of combinations of operating states in response to input clock pulses. At a particular point in the counting sequence output circuitry in the counter produces an output signal. The bistable stages of the counter usually may be set to any combination of operating states of the sequence to serve as a starting point for counting through the sequence.

It is desirable that the output circuitry of a counter be connected to the bistable stages so as to produce an output signal at the proper point in the counting sequence and avoid problems of racing. Individual counters are frequently cascaded to provide a counting arrangement capable of counting through a total counting sequence which is the product of the counting sequences of each individual counter in the cascaded arrangement. In such arrangements it is important that the individual counters operate so as to prevent the arrangement from producing false outputs. It is also desirable that the individual counters be connected in a cascaded arrangement without the necessity for including much additional logic circuitry in the arrangement.

Further, it is desirable to provide a countercircuit which is amenable to fabrication as a monolithic integrated circuit network in which all of the components providing a complete counter are fabricated in a single chip of semiconductor material.

SUMMARY OF THE INVENTION

A countercircuit in accordance with the present invention includes a plurality of bistable circuits each of which includes first and second sections of a flip-flop and feedback connections between them for causing the sections to operate in different operating conditions. A bistable circuit may be considered to be in a first operating state when its first section is in a first operating condition and its second section is in a second operating condition, and may be considered to be in a second operating state when its first section is in the second operating condition and its second section is in the first operating condition.

The countercircuit includes triggering means for changing the operating states of the bistable circuits. The bistable circuits are interconnected by enabling means which are operable to condition the bistable circuits so as to enable them to be switched through a predetermined recurring sequence of combinations of operating states by operation of the triggering means.

An output circuit of the counter circuit includes a first circuit means connected to the second section of the flip-flop of one of the plurality of bistable stages. The first circuit means operates to produce an output signal at its output connection a first predetermined period of time after the second section of the one of the plurality of bistable circuits has been switched from the first operating condition to the second operating condition. A second circuit means of the output circuit is connected to the first section of the flip-flop of another of the plurality of bistable circuits and also to the output connection of the first circuit means. The second circuit means operates to produce an output signal at its output connection a second predetermined period of time after receipt of an output signal from the first circuit means when the first section of the other of the plurality of bistable circuits is in the first operating condition. A third circuit means of the output circuit is connected to the first section of the flip-flop of the aforementioned one of the plurality of bistable circuits and to the output connection of the second circuit means. The third circuit means operates to produce an output signal at its output connection upon receipt of an output signal from the second circuit means when the first section of the aforementioned one of the plurality of bistable circuits is in the first operating condition.

In accordance with the invention individual countercircuits as described above may be cascaded to provide a counting arrangement having a total number of combinations of operating states which is the product of the number of combinations of each countercircuit in the cascaded arrangement. Each of the countercircuits includes an input circuit means having a clock pulse input terminal for applying clock pulses thereto and two information input terminals for applying information signals thereto. Input gating means connected to the clock pulse input terminal and to the two information input terminals produces a triggering pulse at the triggering means to cause the triggering means to change the operating states of the bistable circuits in response to a clock pulse at the clock pulse input terminal while each of the information input terminals is either open circuited or has an information signal equal to the output signal at the output connection of the third circuit means applied thereto. Each countercircuit circuit also includes a control circuit means connected to one of the information input terminals and to the third circuit means. The control circuit means operates to prevent an output signal from being produced at the output connection of third circuit means when a particular information signal is present at the one information input terminal.

A plurality of the countercircuits are arranged in order. Means are provided for applying clock pulses simultaneously to the clock pulses input terminals of all the countercircuits. First means connect the output connection of the countercircuit of lowest order to the other of the information input terminals of all the countercircuits of higher order. Second means connect the output connections of each countercircuit except the countercircuit of lowest order and the countercircuit of highest order to the one information input terminal of the countercircuit of next higher order. An output circuit means is connected to the output connection of the countercircuit of lowest order and to the output connection of the countercircuit of highest order. The output circuit means operates to produce an output signal at its output connection when output signals are present at the output connections of both the countercircuit of lowest order and the countercircuit of highest order.

BRIEF DESCRIPTION OF THE DRAWINGS

Various objects, features, and advantages of countercircuits in accordance with the invention will be apparent from the following detailed discussion and the accompanying drawings wherein.

BINARY COUNTER CIRCUIT—GENERAL

Figure 1A:
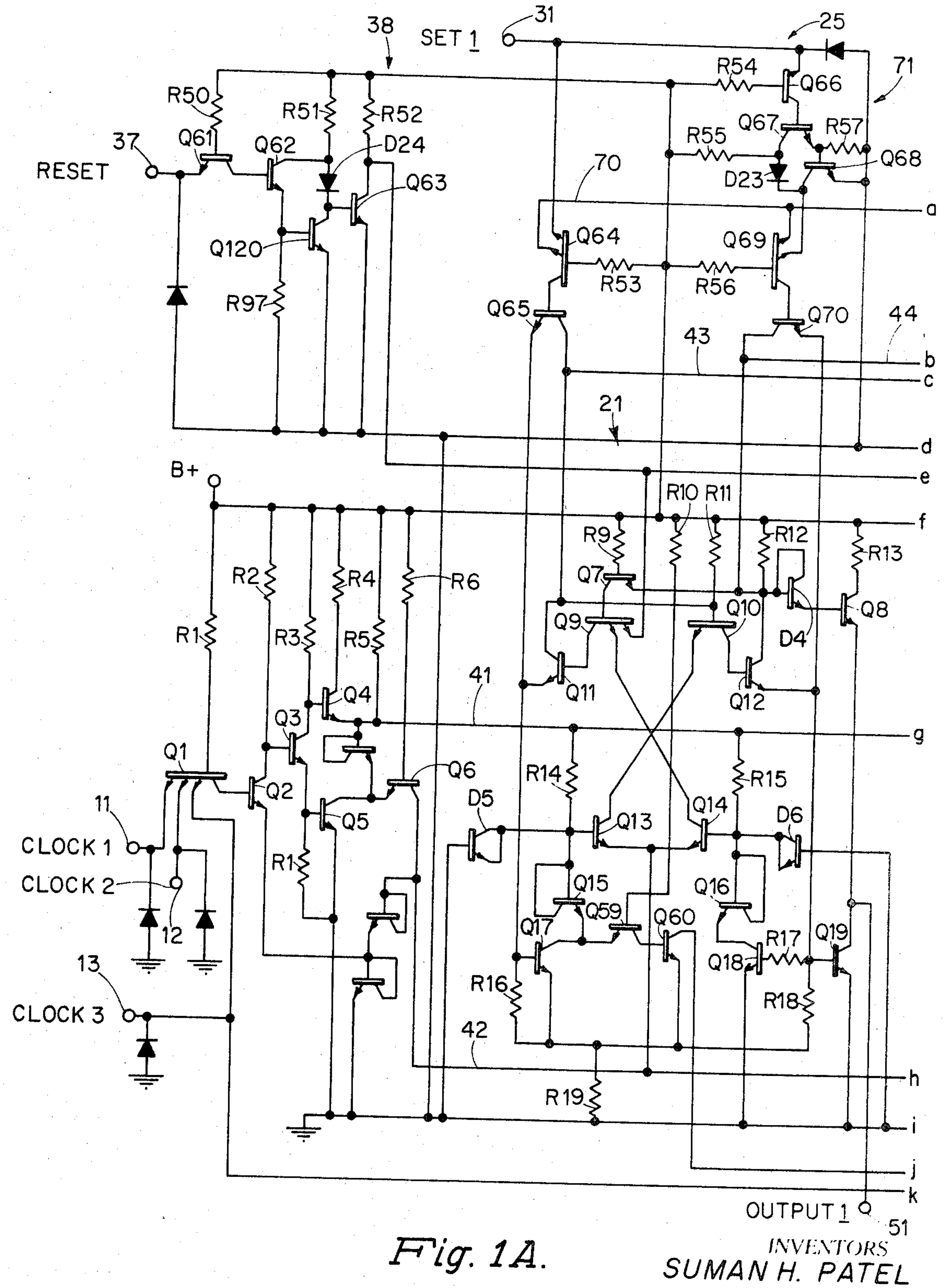
FIGS. 1A, 1B, and 1C form a detailed schematic circuit diagram of a binary countercircuit in accordance with the invention.
Figure 1B:
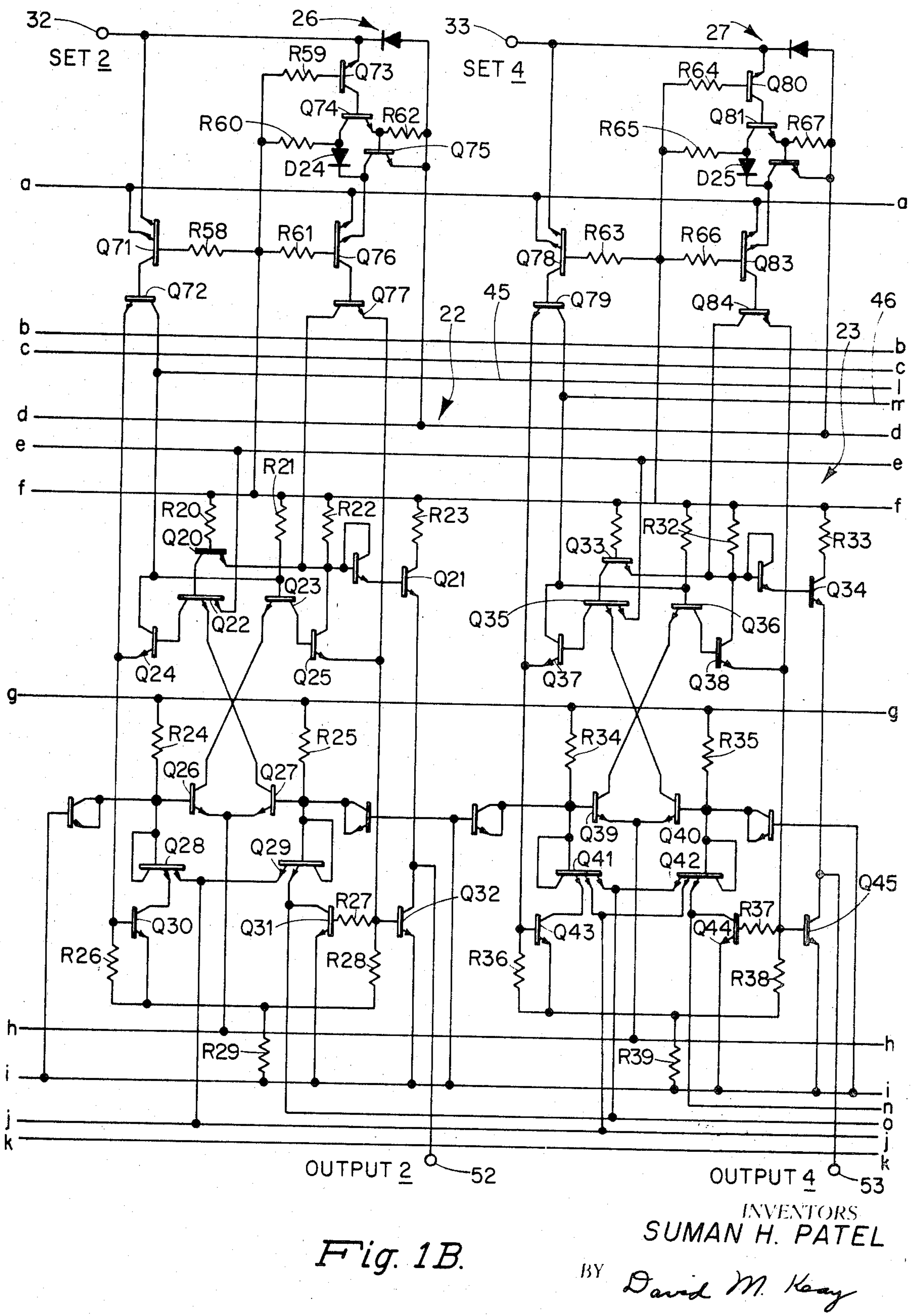
Figure 1C:
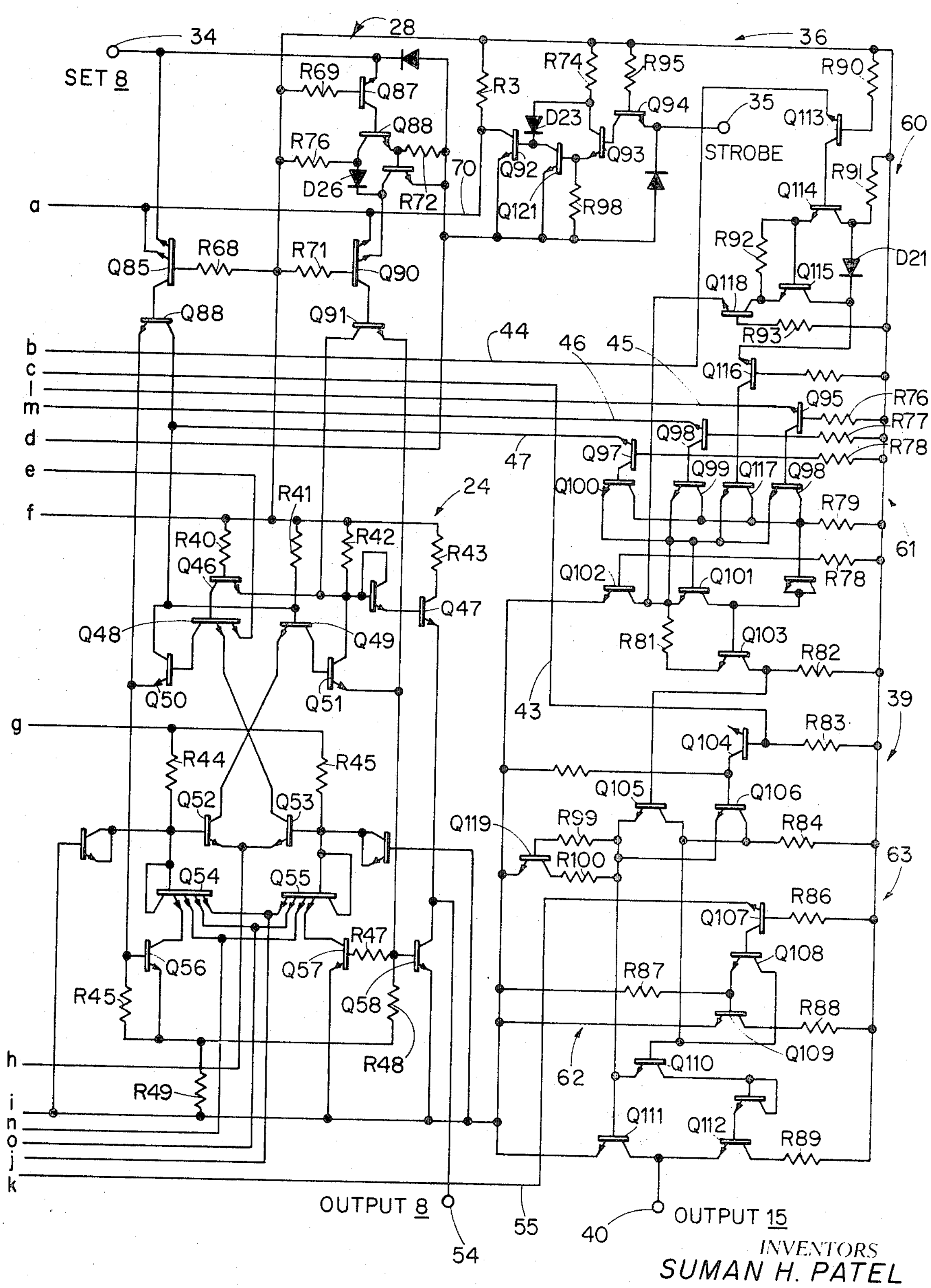
Figure 2:
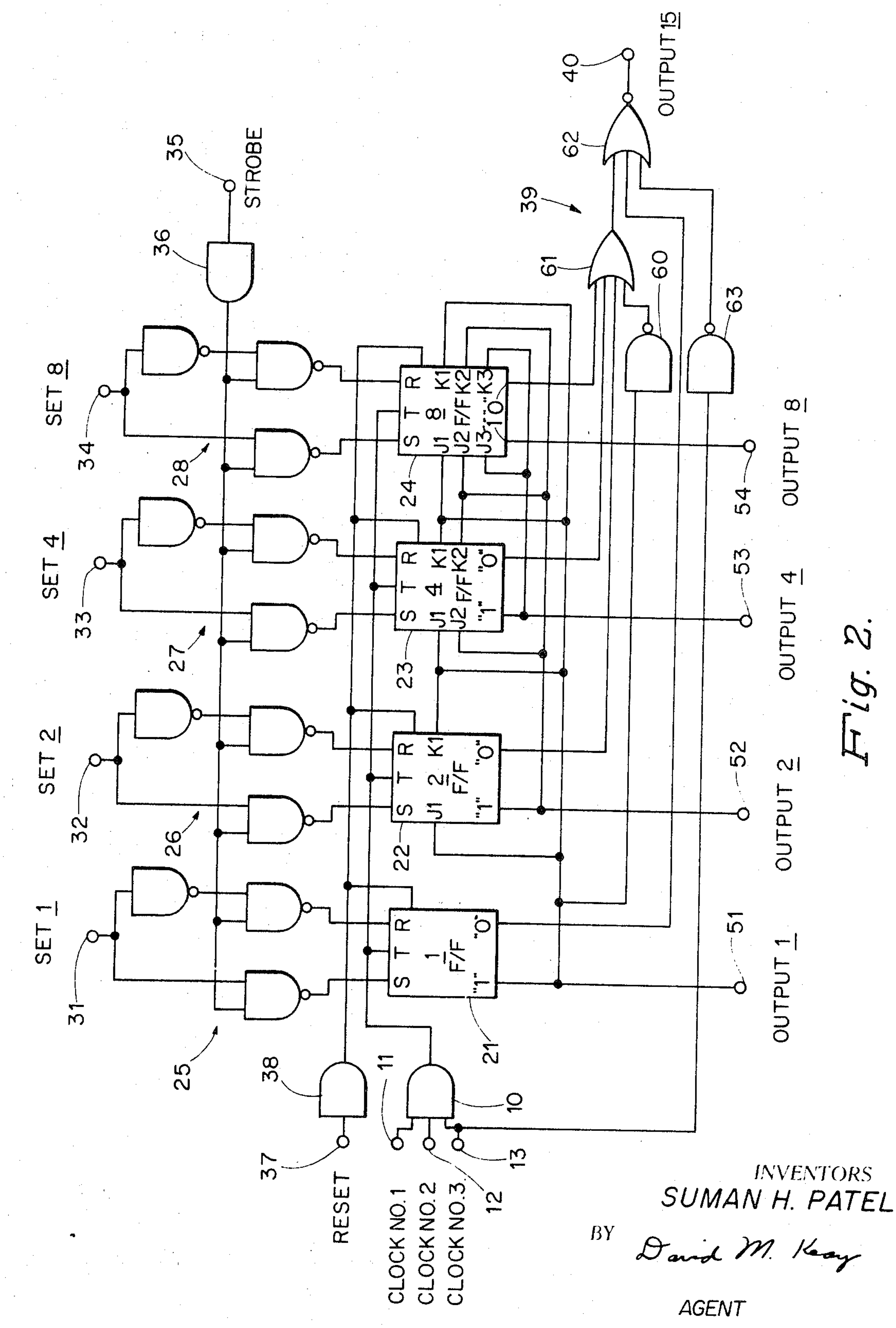
FIG. 2 is an equivalent logic diagram of the binary countercircuit of FIGS. 1A, 1B, and 1C.

FIGS. 1A, 1B, and 1C form a schematic circuit diagram of a binary countercircuit in accordance with the invention. Its equivalent logic diagram is illustrated in FIG. 2. The counter circuit includes an input control and pulse shaping section 10 having three clock pulse input terminals 11, 12, and 13. Four bistable stages 21, 22, 23, and 24 are arranged to receive trigger pulses from the input section and to count up continually through a sequence of 16 combinations of operating states of the bistable stages to provide a binary counter.

The bistable stages may be set to any one of the 16 combinations of operating states by setting circuitry 25, 26, 27, and 28 connected to each of the bistable stages. Each setting circuit has a set input terminal 31, 32, 33, and 34 for applying setting input data to the counter. The setting input data is gated into the bistable stages by a signal at the strobe input terminal 35 of a strobe circuit 36. The bistable stages can all be reset by a suitable signal at the reset input terminal 37 of a reset circuit 38.

Output connections from the bistable stages are made to an output section 39. The output section produces an output pulse at its output terminal 40 when a particular combination of operating states of the bistable stages occurs.

INPUT CONTROL AND PULSE SHAPING SECTION

The input control and pulse shaping section 10 (see FIG. 1A) includes an NPN-multiemitter input transistor Q1 which provides an AND input gate to the pulse shaper. Positive-going clock pulses applied at one of the clock pulse input terminals 11, 12, and 13 are passed through the AND gate when the other clock pulse input terminals are either open circuited or have a relatively high-voltage level signal applied thereto. Clock pulses are shaped by the pulse shaping circuit to provide positive-going trigger pulses having improved leading and trailing edges. Each trigger pulse appears on the two output lines 41 and 42 from the pulse shaping circuit and is applied to the switching circuitry of the bistable stages 21, 22, 23, and 24.

BISTABLE STAGES AND INTERCONNECTIONS

Each of the bistable stages is basically a J-K flip-flop circuit of the type described in U.S. Pat. No. 3,384,766 issued May 21, 1968, to John J. Kardash entitled "Bistable Logic Circuit," and also in application Ser. No. 703,974, filed Feb. 8, 1968, by Shu-Kuang Ho and John J. Kardash entitled "Programmable Frequency Divider" now U.S. Pat. No. 3,518,553, issued June 30, 1970; both assigned to the assignee of the present invention. A bistable stage, for example the first stage 21, may be considered to be in the "0" operating state when its first flip-flop transistor Q11 is nonconducting and its second flip-flop transistor Q12 is conducting. The flip-flop transistors Q11 and Q12 are maintained in these conducting conditions by feedback connections. First and second flip-flop input transistors Q9 and Q10 have their collectors connected to the bases of their associated flip-flop transistors Q11 and Q12 and their bases coupled to the collectors of the opposite flip-flop transistors Q12 and Q11, respectively. When the conducting conditions are reversed such that transistor Q12 is not conducting and transistor Q11 is conducting, the bistable stage may be considered to be in the "1" operating state.

The operating state of the bistable stage is reversed by the receipt of a trigger pulse over the lines 41 and 42 from the input control and pulse shaping section 10. The trigger pulse is applied to switching circuitry in the bistable stage. If the switching circuitry is appropriately conditioned for switching, a charge is stored during the trigger pulse. On the trailing edge of the pulse the switching circuitry employs the stored charge to cause the flip-flop transistors of the stage to reverse conducting conditions.

During the occurrence of a positive-going trigger pulse, whichever control transistor Q17 and Q18 of the stage is in the nonconducting condition by virtue of its base being connected to the emitter of the nonconducting flip-flop transistor Q11 or Q12, respectively, permits a charge to be stored in the base-emitter junction of the associated switching transistor Q13 or Q14 and also in the junction of the associated charge storage diode D5 or D6. The control transistor Q17 or Q18 having its base connected to the emitter of the conducting flip-flop transistor Q11 or Q12, respectively, is biased into conduction during the positive-going trigger pulse thereby causing current flow through the associated resistance R14 or R15 and preventing a charge from being stored in the associated switching transistor Q13 or Q14 and the associated charge storage diode D5 or D6. Since the emitters of the switching transistors Q13 and Q14 are connected to the line 42 from the input section 10, both transistors are prevented from becoming conductive during the trigger pulse.

During the trailing edge of the trigger pulse, a switching transistor Q13 or Q14 having a charge stored in its base-emitter junction and in its associated charge storage diode D5 or D6 is biased to conduction. Current flowing through the switching transistor Q13 or Q14 causes current to flow across the base-emitter junction of the flip-flop input transistor Q10 or Q9 connected to its collector. Current flow through the conducting flip-flop transistor Q12 or Q11 having its base connected to the collector of the affected flip-flop input transistor is reduced, thereby initiating switching action which reverses the operating conditions of the flip-flop transistors. The charge stored in the diode D5 or D6 serves to sustain conduction in the switching transistor Q13 or Q14 for a sufficient period to insure switching.

The other three bistable stages 22, 23, and 24 operate in the same manner during each trigger pulse to change operating conditions when the switching transistor and charge storage diode associated with the flip-flop transistor in the nonconducting condition are not prevented from storing the charge. For example, in the second bistable stage 22 when the flip-flop transistor Q24 is nonconducting and the flip-flop transistor Q25 is conducting, the control transistor Q30 is biased to nonconduction. Therefore, during a trigger pulse a charge should be stored in the switching transistor Q26 and in the charge storage diode D8, so that on the trailing edge of the trigger pulse the operating conditions of the flip-flop transistors would be reversed. However, if a base-emitter junction of inhibiting transistor Q28 (may also be considered a diode since the collector is shorted to the base) is forward biased by virtue of the connection to an emitter, current flows through resistance R24 and no charge will be stored during the trigger pulse and the flip-flop transistors will not change operating conditions.

One of the emitters of inhibiting transistor Q28 is coupled by way of an inverting arrangement of transistors Q59 and Q60 to the collector of control transistor Q17 in the first bistable stage 21. Thus, when control transistor Q17 is conducting by virtue of flip-flop transistor Q11 being in a conducting condition, transistor Q60 is biased in a nonconducting condition and therefore current cannot flow across the one base-emitter junction of inhibiting transistor Q28. When control transistor Q17 is in the nonconducting condition, transistor Q60 is biased so as to permit conduction therethrough. Under these conditions trigger pulse current flows through resistance R24, across the one base-emitter junction of inhibiting transistor Q28, and through transistor Q60, and no charge is stored. Thus, the second bistable stage 22 has an inhibiting input connection such that it is conditioned to be switched from the "0" operating state (flip-flop transistor Q24 nonconducting, flip-flop transistor Q25 conducting) to the "1" operating state (flip-flop transistor Q24 conducting, flip-flop transistor Q25 nonconducting) only when the first bistable stage 21 is in the "1" operating state (flip-flop transistor Q11 conducting, flip-flop transistor Q12 nonconducting).

A second inhibiting transistor Q29 in the second bistable stage 22 also has one emitter coupled to the collector of the control transistor Q17 in the first bistable stage 21 through the inverting arrangement of transistors Q59 and Q60. Thus, the inhibiting input connections from the first bistable stage 21 to the two inhibiting transistors Q28 and Q29 of the second bistable stage 22 are such that the second bistable stage is conditioned to permit switching from either of the operating states to the other only when the first bistable stage 21 is in the "1" operating state.

Inhibiting transistors in the third and fourth bistable stages 23 and 24 have emitters coupled to the collectors of various control transistors so as to provide similar inhibiting functions. However, except for connections to control transistor Q17 which are through the inverting arrangement, direct connections are made from the emitters of the inhibiting transistors to the collectors of appropriate control transistors. Employing the terminology commonly used in conjunction with J-K flip-flop circuits, those input connections to a bistable stage which must be energized by appropriate signals in order to condition the circuit for switching from the "0" operating state to the "1" operating state are designated J input connections and those which must be appropriately energized to condition the bistable circuit for switching from the "1" operating state to the "0" operating state are designated K inputs.

In the counter circuit shown in FIGS. 1A, 1B, and 1C are in the logic diagram of FIG. 2 the bistable stages are appropriately interconnected so as to condition the stages for switching through a recurring sequence of 16 combinations of operating states from 0 0 0 0 (operating states of first, second, third, and fourth bistable stages 21, 22, 23, and 24, respectively), to 1 1 1 1. The bistable stages 21, 22, 23, and 24 may be designated as having values 1, 2, 4, and 8, respectively, when in the "1" operating state. Therefore, the 0 0 0 0 combination of operating states is designated as value 0 and the 1 1 1 1 combination is designated as value 15. The sequence of combinations is a digital counting upward in order from the value 0 to the value 15.

As shown in FIGS. 1A, 1B, and 1C output connections are provided from the bistable stages to the output section 39 by output lines 43, 44, 45, 46, and 47 connected directly to the collectors of flip-flop transistors Q11 and Q12 of the first bistable stage 21, and flip-flop transistors Q24, Q37, and Q50, of the second, third, and fourth bistable stages 22, 23, and 24, respectively. The level of the output voltage on a line is relatively high when the respective flip-flop transistor is nonconducting and is relatively low when the flip-flop transistor is conducting.

The second flip-flop transistors Q12, Q25, Q38, and Q51 of the four bistable stages 21, 22, 23, and 24, are connected through output arrangements to output terminals 51, 52, 53, and 54, respectively. For example, in the first bistable stage 21 transistor Q19 has its collector connected to the output terminal 51 and its base connected to the emitter of the second flip-flop transistor Q12. Thus, when transistor Q12 is in the conducting condition (stage in "0" operating state), transistor Q19 is also conducting and the voltage level at the output terminal 51 is relatively low. When the second flip-flop transistor Q12 is in the nonconducting condition (stage in "1" operating state) transistor Q19 is not conducting and a relatively high-voltage level is produced at the output terminal 51. Transistor Q8 conducts to charge any load and establish the relatively high-voltage level on the output terminal 51 when transistors Q12 and Q19 are switched from conducting to nonconducting conditions. Output arrangements in the other bistable stages operate in a similar manner to provide relatively high-voltage levels at the output terminals 52, 53, and 54 when the associated stage is in the "1" operating state and to provide relatively low-voltage levels at the output terminals when the associated stage is in the "0" operating state.

OUTPUT SECTION

The output section 39 receives signals from the bistable stages over lines 43, 44, 45, 46, and 47 and from the third clock input terminal 13 over line 55 and produces a positive-going signal at its output terminal 40 when all the bistable stages are in the "1" operating state (indicating a value 15) and an appropriate signal condition is present at the third clock input terminal.

Line 44 from the collector of the second flip-flop transistor Q12 of the first bistable stage 21 is connected to the emitter of transistor Q113 of an inverting circuit 60. The inverting circuit includes transistors Q113, Q114, Q118, and Q115. The output of the inverting circuit 60 occurs at the collector of transistor Q115 and is applied to an OR-arrangement 61 at the emitter of transistor Q116.

The collectors of the first flip-flop transistors Q24, Q37, and Q50 of the second, third, and fourth bistable stages 22, 23, and 24 are connected by lines 45, 46, and 47 to the emitters of transistors Q95, Q96, and Q97 respectively, of the OR-arrangement 61. The output of the OR-arrangement 61 occurs at the collector of transistor Q103 and is applied to the base of transistor Q105 of a NOR-circuit 62.

The collector of the first flip-flop transistor Q11 of the first bistable stage 21 is coupled by line 43 and diode Q104 to the base of transistor Q106 of the NOR-circuit 62. The third clock input terminal 13 is connected to the emitter of transistor Q107 of an inverting arrangement 63 of transistors Q107, Q108, and Q109. The output of the inverting arrangement 63 at the collectors of transistors Q108 and Q109 is connected to the base of transistor Q110 of the NOR-circuit 62.

The emitters of transistors Q105, Q106, and Q110 of the NOR-circuit 63 are connected to the base of an output transistor Q111. The output terminal 40 is connected to the collector of the output transistor Q111. When all three transistors Q105, Q106, and Q110 are not conducting, output transistor Q111 is not conducting and a relatively high-voltage level output signal is established at the output terminal 40. If any of the three transistors Q105, Q106, and Q110 are conducting, transistor Q111 conducts and a relatively low-voltage level is produced at the output terminal 40. Transistor Q112 conducts to charge any load and establish the relatively high-voltage level on the output terminal 40 when the output transistor Q111 is switched from the conducting to the nonconducting condition.

When all of bistable stages 21, 22, 23, and 24 are in the "1" operating stage, a relatively high-voltage level is present on line 44 to the inverting circuit 60 and a relatively low-voltage level is present on lines 45, 46, and 47 to the OR-arrangement 61 and on line 43 to the NOR-circuit 62. Under these conditions transistors Q116, Q95, Q96, and Q97 of the OR-arrangement 61 are in the nonconducting condition causing transistor Q105 of the NOR circuit to be nonconducting. Transistor Q106 of the NOR circuit is also nonconducting, and if the third clock input terminal 13 is either open circuited or has a relatively high-voltage level applied thereto, transistor Q110 is also nonconducting. With all three transistors Q105, Q106, and Q110 of the NOR-circuit 62 nonconducting, output transistor Q111 is also nonconducting and a relatively high-voltage level is present at the output terminal 40. If any of the signal conditions to the output section 39 are different, at least one of transistors Q105, Q106, and Q110 will conduct causing output transistor Q111 to conduct and produce a low-voltage level at the output terminal 40.

Figure 4:
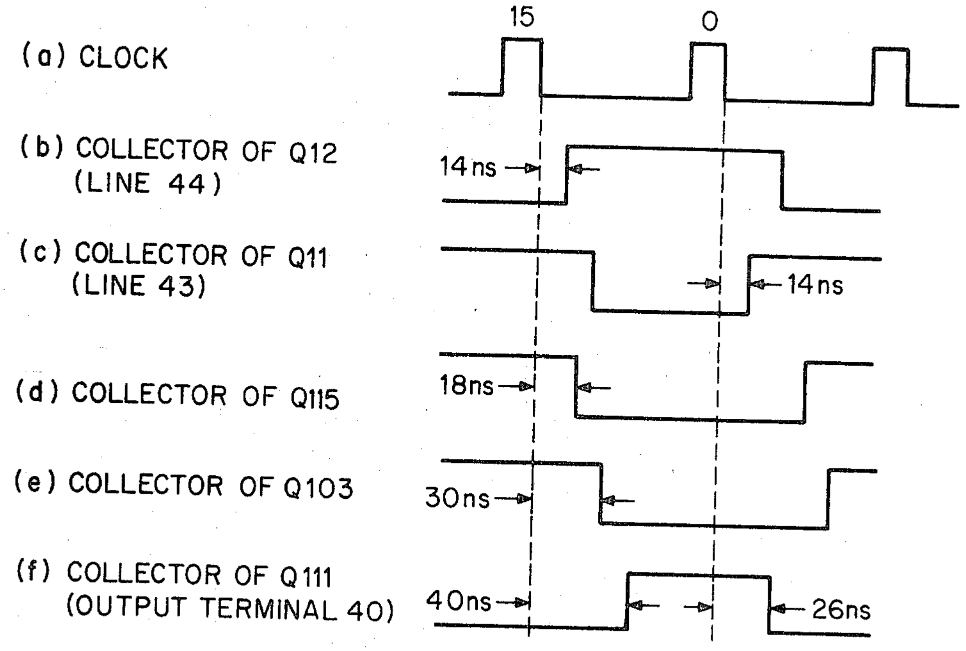
FIG. 4 is a set of idealized curves of voltage conditions at certain points in a countercircuit of the invention during a portion of a counting sequence of the circuit.

Occurrences within the output section 39 which cause the voltage present at the output terminal 40 to be changed from the relatively low level to the relatively high level and from the relatively high level to the relatively low level may best be understood in conjunction with the voltage curves of FIG. 4. When the bistable stages are in the 0 1 1 1 (value 14) combination of operating states, the voltage level on lines 45, 46, and 47 is low. However, the first flip-flop transistor Q11 of the first bistable stage 21 is not conducting and the second flip-flop transistor Q12 of the first bistable stage is conducting; and, therefore, the voltage levels at the emitter of transistor Q116 of the OR-arrangement 61 and on line 43 to the NOR-circuit 62 are both high. It is assumed that the third clock input terminal 13 is either open circuited or has a high-voltage level applied thereto so that the inverting arrangement 63 produces a low-voltage level at the base of transistor Q110 of the NOR-circuit 62.

On the trailing edge of the 15th clock pulse in a counting sequence [curve (*a*) of FIG. 4] switching action is initiated in the first bistable stage 21 to change that stage to the "1" operating state. As explained hereinabove current flows in switching transistor Q13 and across the base-emitter junction of the second input transistor Q10 causing reduced current flow in the second flip-flop transistor Q12. By virtue of the regenerative feedback connections the second flip-flop transistor Q12 is switched to nonconduction and the first flip-flop transistor Q11 is switched to conduction. Since the switching action affects the second flip-flop transistor Q12 before the first flip-flop transistor Q11, the second flip-flop transistor Q12 becomes nonconducting before the first flip-flop transistor Q11 becomes conducting. [Curves (*b*) and (*c*) of FIG. 4.] For illustrative purposes the delay after the trailing edge of the clock pulse before the second flip-flop transistor Q12 becomes nonconducting is shown as 14 nanoseconds.

The delay in the first flip-flop transistor Q11 becoming conductive is slightly longer. The resulting low-voltage level at the collector of the first flip-flop transistor Q11 is immediately applied by line 43 to the base of transistor Q106 of the NOR-circuit 62.

The high voltage on the collector of the second flip-flop transistor Q12 is applied by line 44 to the inverting circuit 60. After a slight propagation delay in the inverting circuit 60 a low-voltage level is produced at the collector of transistor Q115 [curve (*d*) of FIG. 4] and applied at the emitter of transistor Q116 of the OR-arrangement 61. For illustrative purposes the cumulative delay from the trailing edge of the clock pulse is shown as 18 nanoseconds.

Since the emitters of the other three transistors Q95, Q96, and Q97 already have low-voltage levels applied thereto, when the low-voltage level is applied at the emitter of transistor Q116, the OR-arrangement 61 changes its operating state. Delay in the switching action causes the voltage at the collector of transistor Q103 to drop to the low level [curve (*e*) of FIG. 4] after the voltage on line 43 has changed to the low level [curve (*c*) of FIG. 4]. The cumulative delay from the trailing edge of the clock pulse is shown as 30 nanoseconds. Thus, the voltage at the base of transistor Q105 of the NOR-circuit 62 does not become reduced until after the voltage at the base of transistor Q106 has become reduced. When the voltage at the base of Q105 is reduced, that transistor becomes nonconductive and output transistor Q111 is changed to the nonconducting condition producing a high-voltage level at the output terminal 40. [Curve (*f*) of FIG. 4.] The propagation delay of the NOR-circuit 62 is shown as causing a cumulative delay of 40 nanoseconds from the trailing edge of the clock pulse to the leading edge of the positive-going output pulse.

When the next clock pulse is received, the counter circuit is switched from the 1 1 1 1 (value (15) combination of operating states to the 0 0 0 0 (value 0) combination. Since the collector of the first flip-flop transistor Q11 of the first bistable stage 21 is connected by line 43 to the NOR-circuit 62, the change in voltage at the collector of transistor Q11 initiates switching action in the NOR circuit. As shown in curve (*c*) of FIG. 4 there is a 14 nanosecond delay after the trailing edge of the clock pulse before the voltage at the collector of flip-flop transistor Q11 becomes high, and as shown in curve (*f*) of FIG. 4 a cumulative delay of 26 nanoseconds before the output terminal 40 becomes low.

Thus, in summary, the output section 39 employs the change in conducting condition of the second flip-flop transistor Q12 of the first bistable stage 21 delayed by propagation through the inverting circuit 60, the OR-arrangement 61, and the NOR-circuit 62, to control the timing of the leading edge of the positive-going output pulse at the output terminal 40. The timing of the trailing edge of the output pulse is controlled by the change in conducting condition of the first flip-flop transistor Q11 of the first bistable stage 21 delayed by propagation through the NOR-circuit 62. The cumulative delay from the trailing edge of the triggering clock pulse to the leading edge of the output signal is greater than the cumulative delay from the trailing edge of the next triggering clock pulse to the trailing edge of the output signal. As shown in the curves of FIG. 4 the cumulative delays are 40 nanoseconds and 26 nanoseconds, respectively. The advantages of a counter circuit having an output section providing relative delays of this nature will be more apparent from the discussion of a cascaded arrangement of counter circuits hereinbelow.

SETTING CIRCUITRY

The countercircuit may be cleared, that is, all the bistable stages set to the "0" operating state, by application of a pulse of relatively low-voltage level to the reset terminal 37. Under normal operating conditions a relatively high-voltage level is maintained at the reset terminal 37. A low-voltage level at the reset terminal 37 biases transistor Q63 to conduction and forward biases the base-emitter junctions of the first flip-flop input transistors Q9, Q22, Q35, and Q48 of each of the bistable stages. Current flow through these transistors reduces the voltage level at their collectors thereby reducing conduction through any of the associated first flip-flop transistors Q11, Q24, A37, and Q50 which may be conducting. The switching goes to completion setting all the second flip-flop transistors Q12, Q25, Q38, and Q51 in the conducting condition and thus all the bistable stages in the "0" operating state.

In order to set the counter circuit to any selected one of the combination of operating states, the bistable stages are individually set to either the "1" or "0" operating state by means of setting circuits, 25, 26, 27, and 28 under the control of the strobe circuit 36. Each setting circuit includes a set input terminal 31, 32, 33, and 34 for receiving setting information signals, a relatively high-voltage level for "1" or a relatively low-voltage level for "0." A positive-going pulse at the strobe input terminal 35 causes the strobe circuit 36 to produce a signal on control line 70 gating the setting information data to the bistable stages and thus setting the bistable stages to the appropriate operating states.

The setting circuitry together with its manner of operation is described in detail in application, Ser. No. 61,926, filed concurrently herewith by Suman H. Patel, entitled "Bistable Logic Circuit" and assigned to the assignee of the present invention.

DECADE COUNTER

Figure 3:
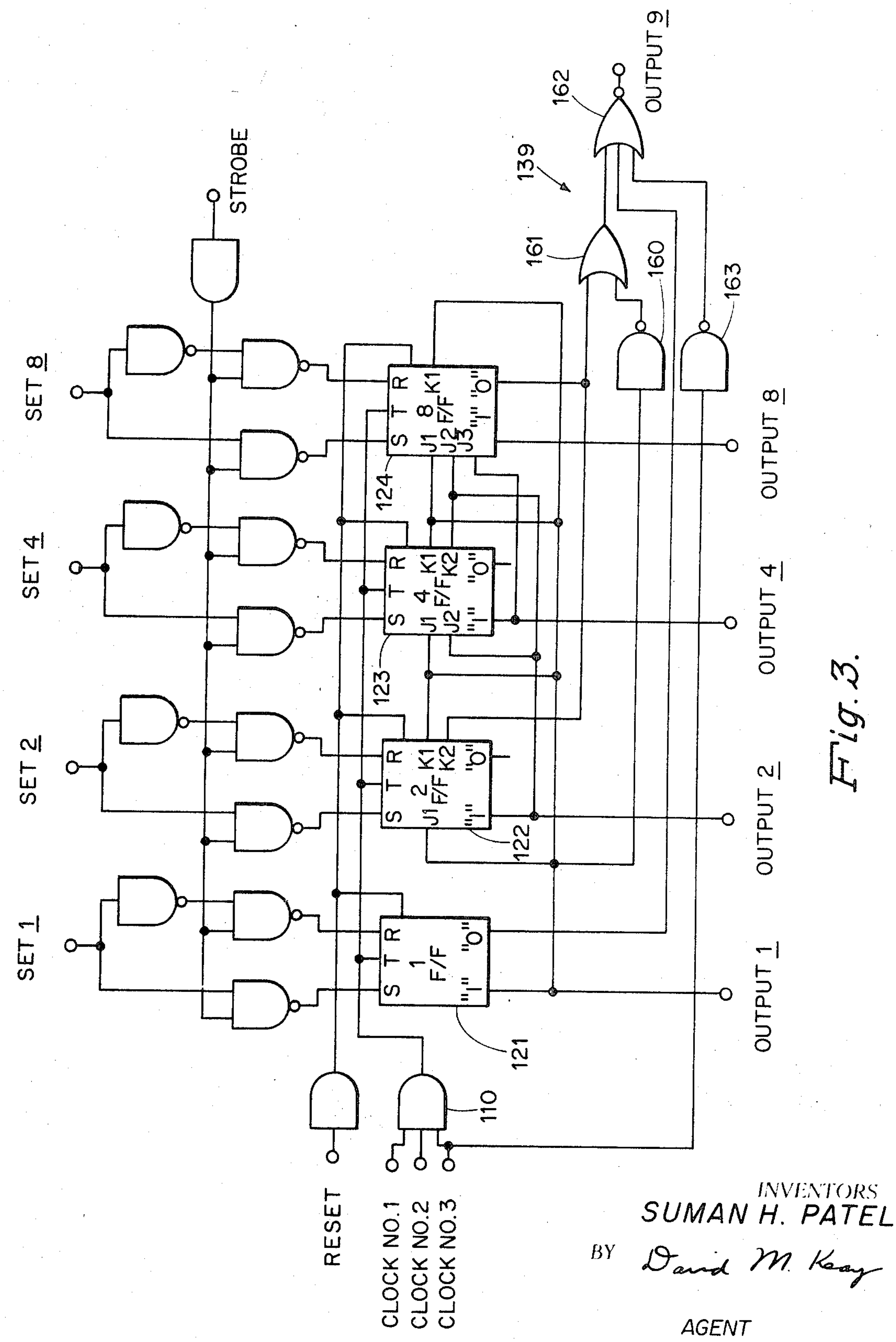
FIG. 3 is an equivalent logic diagram of a decade countercircuit in accordance with the invention.

FIG. 3 is a logic diagram of a decade counter similar to the binary counter of FIGS. 1A, 1B, and 1C, and 2 except that the circuit counts upward through a recurring sequence of 10 combinations of operating states of the bistable stages rather than 16. The input control and the pulse-shaping section 110, the individual bistable stages 121, 122, 123, and 124, and the setting circuitry are the same as those shown in the logic diagram of FIG. 2 and the circuit diagram of FIGS. 1A, 1B, and 1C. The interconnections between the flip-flop transistors and the inhibiting transistors of other stages, which constitute J and K input connections, are such as to establish a recurring sequence of 10 combinations of operating states to provide a decade counter.

The output section 139 is simplified from that in FIGS. 1 and 2 since information on the operating states of only the first and fourth bistable stages 121 and 124 are required in order to determine the existence of the 1 0 0 1 (value 9) combination of operating states. The OR-arrangement 161 requires only two input connections rather than four, one from the second flip-flop transistor of the first bistable stage 121 through the inverting circuit 160 and the other from the first flip-flop transistor of the fourth bistable stage 124. The NOR-circuit 162 is essentially the same having one input from the OR-arrangement 161, another from the first flip-flop transistor of the first bistable stage 121, and another from the third clock input terminal through the inverting arrangement 163. Thus, the output section 139 operates in the same manner to produce the voltage curves of FIG. 4 at the corresponding points in the circuit subsequent to the 9th clock pulse in a sequence.

COUNTING ARRANGEMENT OF FIG. 5

Figure 5:
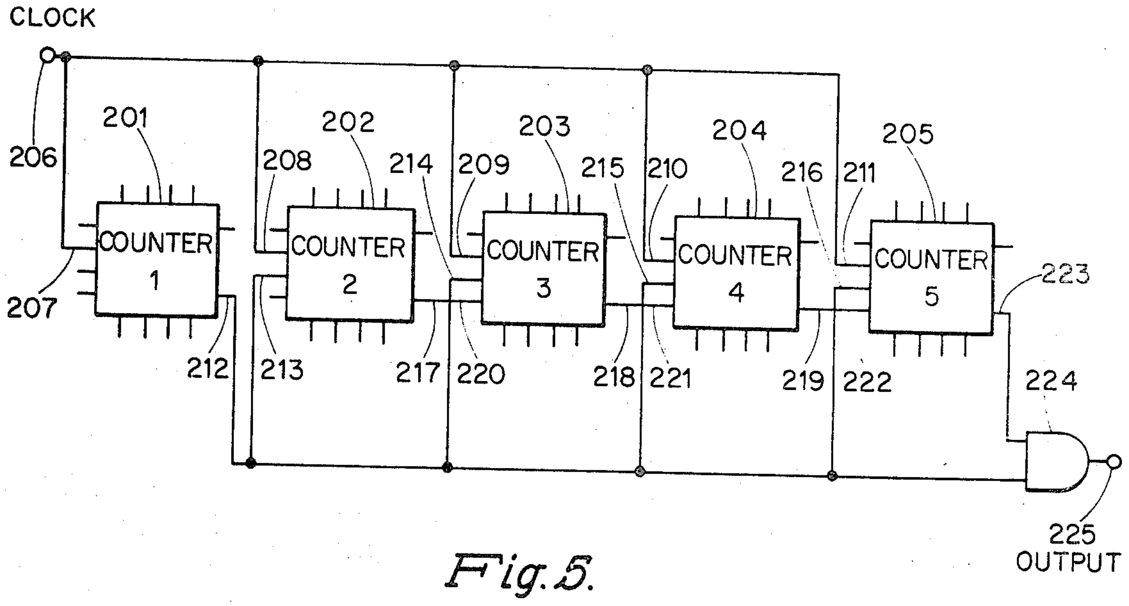
FIG. 5 is a block diagram of a counter employing five of the countercircuits of the invention in a cascaded arrangement.

FIG. 5 is a block diagram of a counting arrangement employing five countercircuits as shown in FIGS. 1A, 1B, 1C, and 2 or in FIG. 3 cascaded in series to provide a counter for counting up to five magnitudes greater than a single countercircuit. The countercircuits 201, 202, 203, 204, and 205 each of which may be in the form of a single integrated circuit, are shown arranged in ascending order of magnitude. Clock pulses are applied at a clock input terminal 206 and from there to the clock pulse input terminals 207, 208, 209, 210, and 211 of the countercircuits. The output terminal 212 of the countercircuit 201 of lowest order is connected to the second clock input terminals 213, 214, 215, and 216 of all the countercircuits of higher order 202, 203, 204, and 205. The output terminals 217, 218, and 219 of the countercircuits 202, 203, and 204, respectively, except those of lowest and highest order are individually connected to the third clock input terminals 220, 221, and 222 of the counter circuits 203, 204, and 205, respectively, next succeeding them in order. The output terminal 212 of the countercircuit 201 of lowest order and the output terminal 223 of the countercircuit 205 of highest order are separately connected to the input connections of an AND-gate 224. The output of the arrangement is produced at the output terminal 225 of the AND gate.

The counting arrangement counts upward from whatever value has been set into the countercircuits by the setting circuitry to produce a positive-going output pulse at the output terminal 225 when all the counting circuits are at their maximum value (all value 15 for binary counters, all value 9 for decade counters). The different propagation delays which determine the timing of the leading and trailing edges of the output signals prevent false outputs. For example, if the countercircuits 201, 202, 203, 204, and 205 are binary counters, when they have counted to the values 9, 9, 9, 9, 8, respectively, the next clock pulse changes them to the values 0, 0, 0, 0, 9. If the leading edge of the positive-going signal at the output terminal 223 of the fifth countercircuit 205 should occur before the termination of the high-level signal on the output terminal 212 of the first countercircuit 201, the AND-gate 224 would incorrectly produce a positive-going signal at the output terminal 225 until the trailing edge of the high-level signal on the output terminal 212 of the first counter circuit 201 should occur. However, since the delay from the clock pulse to the leading edge of an output pulse is greater than the delay from the clock pulse to the trailing edge of an output pulse, the low-voltage level appears at the output terminal 212 of the first countercircuit 201 before the high-voltage levels appears at the output terminal 223 of the fifth countercircuit 205. Therefore, no false output signal is produced at the output terminal 225 of the counter arrangement.

As illustrated by FIG. 5 counter circuits in accordance with the invention can readily be cascaded in series to any number. The only logic required in addition to the countercircuits is the single AND gate having two inputs, one from the output of the first countercircuit and the other from the output of the last counter circuit. Since each countercircuit may be fabricated as an integrated circuit network in a single chip of semiconductor material, a counter of any desired magnitude may be constructed with very few logic interconnections between units.

While there has been shown and described what is considered a preferred embodiment of the present invention, it will be obvious to those skilled in the art that various changes and modifications may be made therein without departing from the invention as defined in the appended claims.

What is claimed is:

1. A countercircuit including in combination
a plurality of bistable circuits, each bistable circuit including
a first section of a flip-flop having a first operating condition and a second operating condition,
a second section of a flip-flop having a first operating condition and a second operating condition, and
feedback connections between the first and second sections of the flip-flop for causing the first and second sections to operate in different operating conditions,
said bistable circuit being in a first operating state when the first section of the flip-flop is in the first operating condition and the second section of the flip-flop is in the second operating condition, and being in a second operating state when the first section of the flip-flop is in the second operating condition and the second section of the flip-flop is in the first operating condition;
triggering means operable to change the operating states of the bistable circuits;
enabling means interconnecting the bistable circuits and operable to condition the bistable circuits to be switched through a predetermined recurring sequence of combinations of operating states by operation of the triggering means; and
an output circuit including
first circuit means connected to the second section of the flip-flop of one of the plurality of bistable circuits and operable to produce an output signal at its output connection a first predetermined period of time after the second section of said one of the plurality of bistable circuits has switched from the first operating condition to the second operating condition;
second circuit means connected to the first section of the flip-flop of another of the plurality of bistable circuits and to the output connection of the first circuit means and operable to produce an output signal at its output connection a second predetermined period of time after receipt of an output signal from the first circuit means when the first section of said another of the plurality of bistable circuits is in the first operating condition; and
third circuit means connected to the first section of the flip-flop of said one of the plurality of bistable circuits and to the output connection of the second circuit means and operable to produce an output signal at its output connection upon receipt of an output signal from the second circuit means when the first section of said one of the plurality of bistable circuits is in the first operating condition.

2. A countercircuit in accordance with claim 1 including
input circuit means connected to said triggering means and operable to produce a triggering pulse to cause the triggering means to change the operating states of the bistable circuits in response to the occurrence of a predetermined signal condition at the input thereto;
and wherein
when the operating state of a bistable circuit is changed by a triggering pulse, one section of the flip-flop switches from its first operating condition to its second operating condition a predetermined first delay period subsequent to the triggering pulse and the other section of the flip-flop switches from its second operating condition to its first operating condition a predetermined second delay period subsequent to the triggering pulse, said second delay period being greater than said first delay period; and
the sum of said first delay period, said first predetermined period of time of operation of the first circuit means, and said second predetermined period of time of operation of the second circuit means is greater than said second delay period.

3. A countercircuit in accordance with claim 2 wherein
said triggering means includes
a plurality of switching means each connected to an associated one of said bistable circuits, and
trigger connecting means for applying triggering pulses to each of said plurality of switching means,
said plurality of switching means being operable to switch the bistable circuits from any combination of operating states of said predetermined recurring sequence of combinations to the next combination of operating states of said predetermined sequence upon termination of a triggering pulse;
said input circuit means includes a clock pulse input terminal for applying clock pulses thereto, a plurality of information input terminals for applying information signals thereto, and input gating means connected to said clock pulse input terminal, said information input terminals, and said triggering means and operable to produce a triggering pulse at said triggering means in response to the presence of a clock pulse at the clock pulse input terminal while a predetermined combination of information signals are present at the information input terminals;

and including control circuit means connected to one of the plurality of information input terminals and to said third circuit means and operable to prevent an output signal from being produced at the output connection of the third circuit means when a particular information signal is present at said one of the plurality of information input terminals.

4. A countercircuit in accordance with claim 3 wherein the input gating means of the input circuit means is operable to produce a triggering pulse at said triggering means in response to the presence of a clock pulse at the clock pulse input terminal while each of the information input terminals is open circuited or has an information signal equal to the output signal at the output connection of the third circuit means applied thereto.

5. A counter circuit in accordance with claim 2 wherein each section of a flip-flop produces a first voltage level at an output connection when the section is in the second operating condition and produces a second voltage level at the output connection when the section is in the first operating condition;

said first circuit means is connected to the output connection of the second section of the flip-flop of the one of the plurality of bistable circuits and is operable to change the voltage level at its output connection from the first voltage level to the second voltage level said first predetermined period of time after the voltage level at the output connection of the second section has changed from the second voltage level to the first voltage level;

said second circuit means is connected to the output connection of the first section of the flip-flop of said another of the plurality of bistable circuits and to the output connection of the first circuit means and is operable to change the voltage level at its output connection from the first voltage level to the second voltage level said second predetermined period of time after the voltage level at the output connection of the first circuit means has changed from the first voltage level to the second voltage level while the voltage level at the output connection of said first section is at the second voltage level;

said control circuit means connected to the one of the plurality of information input terminals is operable to produce a first voltage level at its output connection when a second voltage level is present at said one information input terminal and is operable to produce a second voltage level at is output connection when a first voltage level is present at said one information input terminal; and said third circuit means is connected to the output connection of the first section of the flip-flop of said one of the plurality of bistable circuits, to the output connection of the second circuit means, and to the output connection of said control circuit means and is operable to produce the second voltage level at its output connection when the first voltage level is present at the output connection of the first section of the flip-flop of said one of the plurality of bistable circuits, at the output connection of the second circuit means, or at the output connection of said circuit means, and is operable to produce the first voltage level at its output connection when the second voltage level is present at the output connection of the first section of the flip-flop of said one of the plurality of bistable circuits, at the output connection of the second circuit means, and at the output connection of said control circuit means.

6. A countercircuit in accordance with claim 5 wherein the input gating means of the input circuit means is operable to produce a triggering pulse at said triggering means in response to the presence of a clock pulse at the clock pulse input terminal while each of the information input terminals is open circuited or has an information signal of the first voltage level at the output connection of the third circuit means applied thereto.

7. A countercircuit in accordance with claim 6 including setting means for setting the bistable circuits to any combination of operating states of said predetermined sequence.

8. A circuit arrangement including in combination a plurality of countercircuit in accordance with claim 4 arranged in order, the input circuit means of each countercircuit having said clock pulse input terminal, said one information input terminal, and another information input terminal;

means for applying clock pulses simultaneously to the clock pulse input terminals of all the counter circuits;

first means connecting the output connection of the countercircuit of lowest order to said other information input terminals of all the counter circuits of higher order;

second means connecting the output connections of each countercircuit except the counter circuit of lowest order and the counter circuit of highest order to said one information input terminal of the countercircuit of next higher order; and output circuit means connected to the output connection of the countercircuit of lowest order and to the output connection of the countercircuit of highest order and operable to produce an output signal at its output connection when output signals are present at the output connections of both the countercircuit of lowest order and the countercircuit of highest order.

9. A circuit arrangement including in combination a plurality of countercircuits in accordance with claim 6 arranged in order, the input circuit means of each countercircuit having said clock pulse input terminal, said one information input terminal, and another information input terminal;

means for applying clock pulses simultaneously to the clock pulse input terminals of all the counter circuits;

first means connecting the output connection of the countercircuit of lowest order to said other information input terminals of all the countercircuits of higher order;

second means connecting the output connections of each countercircuit except the countercircuit of lowest order and the countercircuit of highest order to said one information input terminal of the countercircuit of next higher order; and output circuit means connected to the output connection of the countercircuit of lowest order and to the output connection of the countercircuit of highest order and operable to produce a first voltage level at its output connection when the first voltage level is present at the output connections of both the countercircuit of lowest order and the counter circuit of highest order.

* * * * *